United States Patent
Karhade et al.

(10) Patent No.: US 10,157,860 B2
(45) Date of Patent: Dec. 18, 2018

(54) COMPONENT STIFFENER ARCHITECTURES FOR MICROELECTRONIC PACKAGE STRUCTURES

(71) Applicant: Intel Corporation, Santa Clara, CA (US)

(72) Inventors: Omkar G. Karhade, Chandler, AZ (US); Kedar Dhane, Chandler, AZ (US); Yongki Min, Phoenix, AZ (US); William J. Lambert, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/392,145

(22) Filed: Dec. 28, 2016

(65) Prior Publication Data

US 2018/0182718 A1 Jun. 28, 2018

(51) Int. Cl.
*H01L 21/00* (2006.01)
*H01L 23/495* (2006.01)
*H01L 23/00* (2006.01)
*H01L 23/31* (2006.01)
*H01L 23/498* (2006.01)
*H01L 21/48* (2006.01)

(52) U.S. Cl.
CPC ........ *H01L 23/562* (2013.01); *H01L 21/4853* (2013.01); *H01L 23/3142* (2013.01); *H01L 23/49811* (2013.01)

(58) Field of Classification Search
CPC .................................................. H01L 23/562

USPC ................................. 438/123; 257/669, 674
See application file for complete search history.

(56) References Cited

U.S. PATENT DOCUMENTS

| | | |
|---|---|---|
| 9,603,295 B2 * | 3/2017 | Yamaguchi ............. H01L 24/16 |
| 2007/0278647 A1 | 12/2007 | Morita |
| 2008/0099910 A1 | 5/2008 | McLellan et al. |
| 2011/0018125 A1 | 1/2011 | Loo et al. |
| 2015/0021754 A1 | 1/2015 | Lin et al. |

FOREIGN PATENT DOCUMENTS

WO 2016140793 9/2016

OTHER PUBLICATIONS

International Search Report and Written Opinion for International Patent Application No. PCT/US17/61735, dated Feb. 28, 2018.

* cited by examiner

*Primary Examiner* — Calvin Lee
(74) *Attorney, Agent, or Firm* — Green, Howard & Mughal LLP

(57) ABSTRACT

Methods of forming microelectronic package structures, and structures formed thereby, are described. Those methods/ structures may include attaching a stiffener on a substrate, wherein a first section of the stiffener and a second section of the stiffener are on opposite sides of an opening. At least one component may be attached on the substrate within the opening, wherein the at least one component is disposed between the first section of the stiffener and the second section of the stiffener, and wherein the stiffener comprises a grounding structure disposed on the substrate.

23 Claims, 8 Drawing Sheets

COMPONENT STIFFENER ARCHITECTURES FOR MICROELECTRONIC PACKAGE STRUCTURES

BACKGROUND

Warpage in thin microelectronic package structures has been a challenge in the fabrication of packaged devices. Temperature coefficients of thermal expansion (CTE) may differ between a device and a package substrate, which contributes to the problem. Temperature processing, such as a solder reflow process, may contribute to a significant amount of warpage, which in turn can cause opens in circuitry, resulting in loss of yield and reduced reliability of a packaged device. Stiffeners, such as metal stiffeners, can be employed which may reduce warpage in thin packages during temperature processing.

BRIEF DESCRIPTION OF THE DRAWINGS

While the specification concludes with claims particularly pointing out and distinctly claiming certain embodiments, the advantages of these embodiments can be more readily ascertained from the following description when read in conjunction with the accompanying drawings in which:

DETAILED DESCRIPTION

Figure 1A:
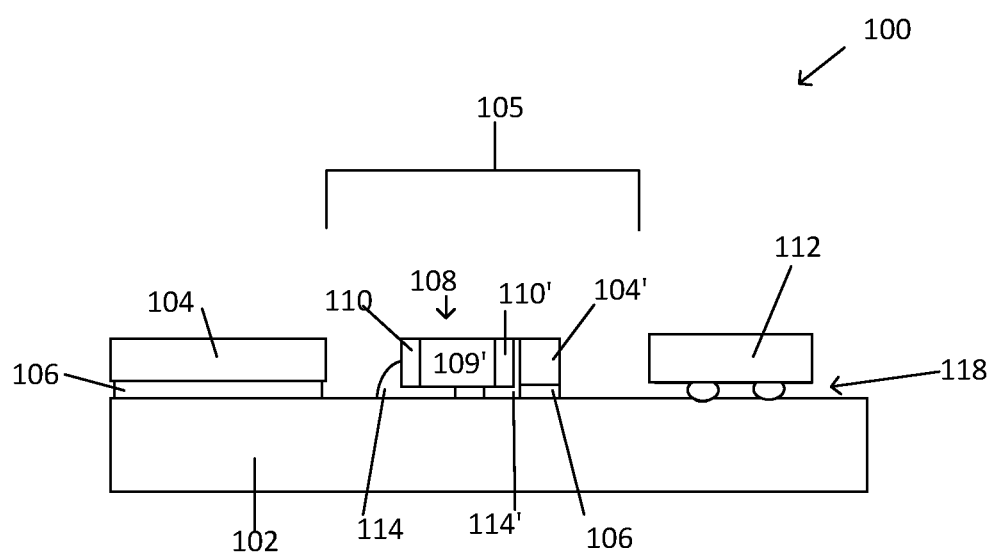
FIG. 1a represents a cross-sectional view of structures according to embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments.

The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views. The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Layers and/or structures "adjacent" to one another may or may not have intervening structures/layers between them. A layer(s)/structure(s) that is/are directly on/directly in contact with another layer(s)/structure(s) may have no intervening layer(s)/structure(s) between them.

Various implementations of the embodiments herein may be formed or carried out on a substrate, such as a package substrate. A package substrate may comprise any suitable type of substrate capable of providing electrical communications between an electrical component, such a an integrated circuit (IC) die, and a next-level component to which an IC package may be coupled (e.g., a circuit board). In another embodiment, the substrate may comprise any suitable type of substrate capable of providing electrical communication between an IC die and an upper IC package coupled with a lower IC/die package, and in a further embodiment a substrate may comprise any suitable type of substrate capable of providing electrical communication between an upper IC package and a next-level component to which an IC package is coupled.

A substrate may also provide structural support for a die. By way of example, in one embodiment, a substrate may comprise a multi-layer substrate—including alternating layers of a dielectric material and metal—built-up around a core layer (either a dielectric or a metal core). In another embodiment, a substrate may comprise a coreless multi-layer substrate. Other types of substrates and substrate materials may also find use with the disclosed embodiments (e.g., ceramics, sapphire, glass, etc.). Further, according to one embodiment, a substrate may comprise alternating layers of dielectric material and metal that are built-up over a die itself—this process is sometimes referred to as a "bumpless build-up process." Where such an approach is utilized, conductive interconnects may or may not be needed (as the build-up layers may be disposed directly over a die, in some cases).

A die may include a front-side and an opposing back-side. In some embodiments, the front-side may be referred to as the "active surface" of the die. A number of interconnects may extend from the die's front-side to the underlying substrate, and these interconnects may electrically couple the die and substrate. In some cases a die may be directly coupled to a board, such as a motherboard. Interconnects/traces may comprise any type of structure and materials capable of providing electrical communication between a die and substrate/board. In some one embodiment, a die may be disposed on a substrate in a flip-chip arrangement. In an embodiment interconnects comprises an electrically conductive terminal on a die (e.g., a pad, bump, stud bump, column, pillar, or other suitable structure or combination of structures) and a corresponding electrically conductive terminal on the substrate (e.g., a pad, bump, stud bump, column, pillar, or other suitable structure or combination of structures).

Solder (e.g., in the form of balls or bumps) may be disposed on the terminals of the substrate and/or die, and these terminals may then be joined using a solder reflow process. Of course, it should be understood that many other types of interconnects and materials are possible (e.g., wirebonds extending between a die and substrate). In some embodiments herein, a die may be coupled with a substrate by a number of interconnects in a flip-chip arrangement. However, in other embodiments, alternative structures and/or methods may be utilized to couple a die with a substrate.

Embodiments of methods of forming packaging structures, including methods of forming components, such as die side capacitor (DSC) and stiffener structures on a package substrate, are described. Those methods/structures may include attaching a stiffener on a substrate, wherein a first section of the stiffener and a second section of the stiffener are on opposite sides of an opening, attaching at least one component on the substrate within the opening, wherein the at least one component is disposed between the first section of the stiffener and the second section of the stiffener, and wherein the stiffener comprises a grounding structure disposed on the substrate. The embodiments herein enable increased use of the top surface of the substrate real estate, while enhancing mechanical strength of the package substrate, thus reducing warpage and other reliability issues.

The Figures herein illustrate embodiments of fabricating package structures comprising optimized components and stiffener architectures. In FIG. 1a (cross-sectional view), a portion of a package structure 100, is shown. In an embodiment, a substrate 102, may comprise a board such as a fiberglass reinforced epoxy laminated board that is flame retardant (FR4), for example. In another embodiment, the package substrate 102 may comprise a portion of a board, such as a printed circuit board (PCB board), for example, and in other embodiments, the substrate 102 may comprise a motherboard.

In an embodiment, a die/device 112, such as a microelectronic die, may be disposed on a top surface of the substrate 102. In an embodiment, the die 112 may comprise any type of microelectronic device, such as but not limited to a microprocessor, a graphics processor, a signal processor, a network processor, a chipset, etc. In one embodiment, the die 112 comprises a system on a chip (SOC) having multiple functional units (e.g., one or more processing units, one or more graphics units, one or more communications units, one or more signal processing units, one or more security units, etc.). However, it should be understood that the disclosed embodiments are not limited to any particular type or class of die/devices. The device/die 112 may be electrically and physically coupled with the substrate/board 102 by solder balls/conductive structures 118.

A stiffener may be disposed on a top surface of the substrate 102, which may comprise a first section 104 and a second section 104'. A non-conductive adhesive 106 may be disposed between the stiffener 104 and the substrate 102, in an embodiment, and may serve to affix the stiffener 104 to the substrate 102. In an embodiment, the non-conductive adhesive 106 may comprise such materials as epoxy. The stiffener 104 may comprise a metal stiffener in an embodiment, but may comprise any suitable material with which to impart mechanical rigidity to the substrate 102, in other embodiments. The non-conductive adhesive 106 may be disposed between the substrate 102 and the second section of the stiffener 104' as well. In an embodiment, the non-conductive adhesive may be disposed on a first region of the substrate that is beneath the first section 104, and may be disposed in a second region adjacent the first region that is beneath the second section 104' of the stiffener, but may not be disposed between the two sections 104, 104'. The first section 104 and the second section 104' of the stiffener 104 may be on opposite sides of each other, and may be separated by an opening 105. In an embodiment, the stiffener 104 may comprise at least one opening 105.

Figure 1B:
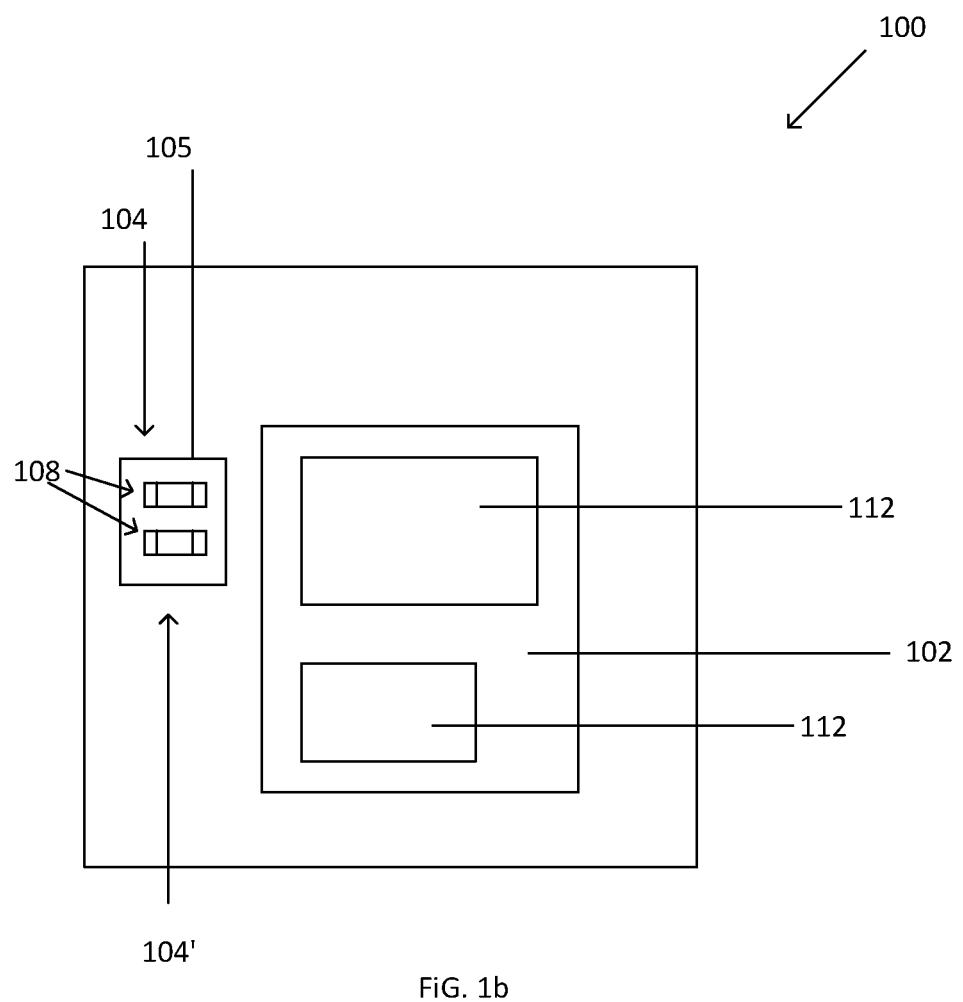
FIG. 1b represents a top view of structures according to embodiments.

A top view of an embodiment of the package structure 100 is depicted in FIG. 1b. The substrate 102 may comprise at least one die 112 disposed thereon, wherein the first and second sides of the stiffener 104, 104' are on opposite sides of each other. At least one component 108 may be disposed within/between the stiffener opening 105.

Referring back to FIG. 1a, the at least one component 108, such as a die-side capacitor, for example, may be adjacent, and in between the first section 104 and the second section 104' of the stiffener 104. In an embodiment, the component(s) 108 may comprise other types of circuit elements, such as a resistor or an inductor, for example. In an embodiment, the component 108 may comprise a conductive material 109', such as copper for example, and contact regions 110, 110' on adjacent sides of the conductive material 109'. In an embodiment, the first section of the stiffener 104 may be adjacent a first contact 110/side of the component 108, and the second section 104' of the component 108 may be adjacent the second contact/side 110' of the component 108. A grounding structure 114' may be disposed between the contact region 110' of the component 108 and the second portion of the stiffener 104'. The grounding structure 114' may comprise any suitable material with which to ground the second section of the stiffener 104' to the substrate 102. In an embodiment, the grounding structure 114' may comprise a solder pad of the component 108. In an embodiment, the component 108 may comprise a grounding structure 114, which may comprise a grounding/solder pad 114, which is between the contact 110 of the component 108, and the substrate 102.

By grounding the second section of the stiffener 104 to the ground pad 114' of the component 108, the top surface of the substrate 102 can be better utilized, for example, by increasing the number of components that may be placed on the top side of the substrate 102, and/or reducing the package size, while reducing warpage in the package structure 100, which may comprise a thin package structure. In an embodiment, the package structure may comprise a thickness of less than about 1 mm. In an embodiment, since the stiffener comprises two sections, a larger stiffener may be used which may further reduce warpage. Since the stiffener 104' is grounded through the solder pad 110' of the component 108, the use of conductive adhesives to ground the stiffener 104 are not necessary. Thus, requirements for additional grounding pad, which consumes real estate on the package top surface, may be eliminated.

In an embodiment, a process flow for assembling the package structure 100 may comprise first forming holes/openings 105 into the stiffener 104 as required for particular dimensions of specific components. Solder may then be printed/dispensed/placed in the form of micro-balls on the component pads 110, 110' and may then be reflowed. Alternatively, solder can be attached using local wave soldering before stiffener placement onto the substrate 102. Next, the stiffener 104 may be attached to the non-conductive adhesive 106 disposed on the substrate 102. Then the component (s) 108 may be placed within the openings onto the substrate 102, and the package may be reflowed. In an embodiment, a thickness of the stiffener may comprise between about 200 microns and between 300 microns. The openings 105 may be formed by using a laser drilling process, in an embodiment. In an embodiment, the component(s) 108 may be placed directly adjacent the second section of the stiffener 104', which saves available space on the top side of the substrate 102, as well as achieves stiffener grounding.

Figure 1C:
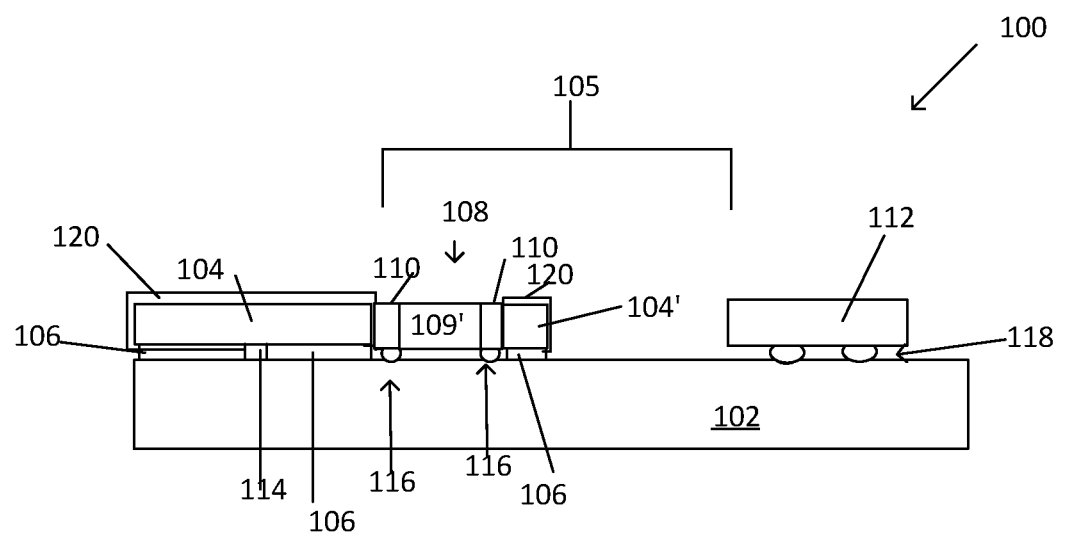
FIG. 1c-1e represent cross sectional views of structures according to embodiments.

FIG. 1c depicts another embodiment of a package substrate 100, wherein a non-conductive coating 120 is disposed on a top surface, side surfaces and at least a portion of a bottom surface of the stiffener, which comprises first section 104 and second section 104'. In an embodiment, the non-conductive coating may comprise such materials as epoxy. A portion of the bottom surface of the first section of stiffener 104 may not comprise the non-conductive coating 120, wherein the portion without the non-conductive coating 120 may comprise a grounding structure 114, that may be disposed between the substrate 102 and the portion of the first section of the stiffener 104. In an embodiment, a component 108 may be directly adjacent and in between both of the non-conductive coatings of the first and second stiffener sections 104, 104'. The component 108 may be physically coupled with solder pads 116 to the substrate 102. At least one die 112 may be adjacent the component 108 and coupled to the substrate 102 with solder connections 118. In an embodiment, the component 108 is directly between and directly disposed on both sections of the stiffener 104, 104' and the first section of the stiffener (and thus the entire stiffener) is grounded to the substrate by the grounding structure 114, which may comprise a solder pad, in an embodiment.

In an embodiment, a process flow may comprise first forming holes in the stiffener 104 to match the dimensions of a particular component, according to design requirements. Then, the stiffener 104 may be coated with a non-conductive material 120 except for one opening that is left for a grounding pad 114. Next, the component(s) may be placed in the stiffener cavities/opening(s) 105 (and may be cured in place, optionally using the same coating material. Solder may then be printed on the substrate 102, and an epoxy may be dispensed such that the epoxy does not block the grounding pad 114, or alternatively, epoxy flux may be dispensed. The stiffener 104 comprising the component(s) 108 may be placed on the substrate 102. The adhesive/epoxy flux can be fully cured, and solder may be reflowed in the same process step, or may be partially cured initially and may be further cured in a following reflow/cure step.

In an embodiment, the non-adhesive, non-conductive coating may comprise a polymer coating, which may be applied with a spray/dipping process, wherein the openings for the ground structure 114 may be formed during the dipping process. In another embodiment, a mechanical/laser/chemical process may be used to form the opening for the grounding structure 114. In an embodiment, the component may be embedded in the stiffener using a friction fit, curing a partially wet polymer coating, or using additional adhesive.

Figure 1D:
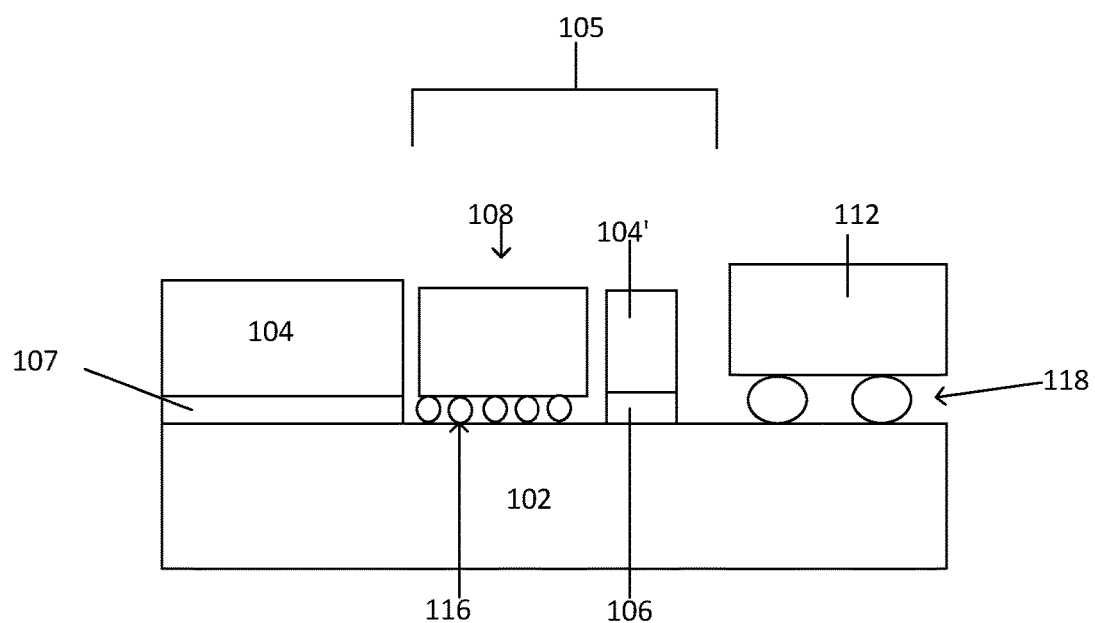

FIG. 1*d* depicts a portion of a package structure 100, wherein a component array 108 may be embedded or placed in the stiffener opening 105. The component array 108 may comprise a plurality of components adjacent each other. A conductive adhesive 107 or a solder grounding material 107 may be disposed between the first section 104 of the stiffener 104 and the substrate 102. The array of components 108 may be adjacent the two stiffener sections 104, 104'. In an embodiment, the component arrays 108 may be formed with processes such as those described previously herein, with respect to FIG. 1*b* and FIG. 1*c*, for example. In an embodiment, a pin, such as a last pin of the component array 108 may be used to short the stiffener 104 to ground, and a non-conductive adhesive may be disposed between the second section of the stiffener 104' and the substrate 102.

Figure 1E:
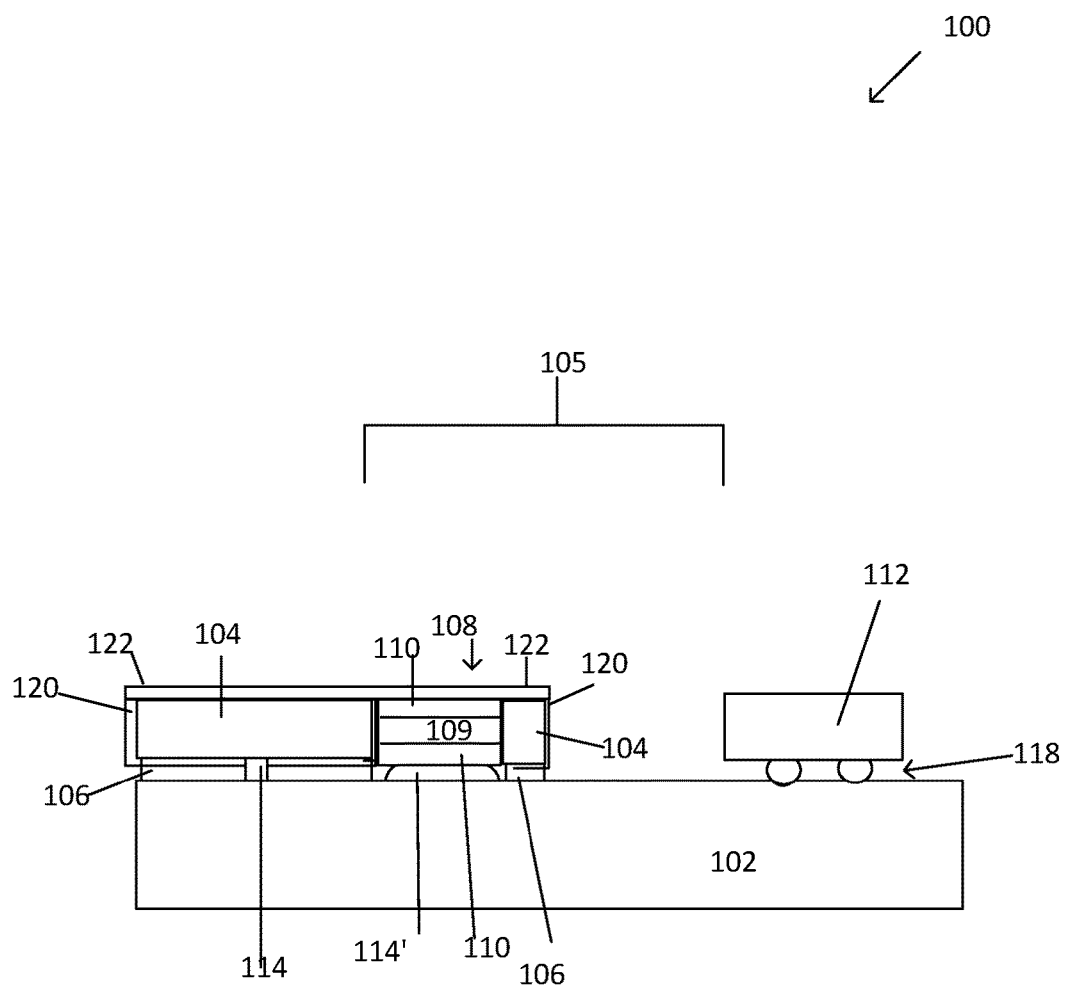

FIG. 1*e* depicts a package structure 100, wherein a vertical component is embedded in the stiffener 104, wherein the vertical component comprises a common grounding structure 114'. Adhesive tape 122 may be disposed on a top surface of the stiffener 104, 104' and on a top surface of the component 108, in an embodiment. A non-conductive coating may be disposed on sidewalls and a bottom surface of the stiffener 104, 104'. The component 108, may be vertically disposed (wherein contacts 110 are disposed on top surface and a bottom surface of the conductive material 109, wherein the contacts 110 extend across the entire top and bottom surfaces, respectively), between the sections of the stiffener 104, 104'. A non-conductive coating 106 may be disposed between the stiffener sections 104, 104' and the substrate 102. A grounding pad/structure 114 is disposed on a bottom region of the first section of the stiffener 104, similar to FIG. 1*c*.

A die 112 may be adjacent the component 108, and may be disposed on the substrate 102 by solder balls 118. In an embodiment, the ground pads 114, 114' may be aligned vertically facing away from the substrate on the stiffener, in an embodiment. The stiffener 104, 104' may be grounded using grounding pad 114. In an embodiment, the component may comprise heights of about 200 microns down to about 125 microns. These components may be placed vertically into the stiffener cavity 105. A grounding layer of conductive adhesive tape or coating 122 may be applied to short the component ground pads to the stiffener, in an embodiment. In an embodiment, only one pad 114' may be required per component 108 on the substrate 102, thus saving significant real estate on the substrate 102.

A process flow for fabricating the package structure 100 may comprise forming openings/cavities in the stiffener, which may be formed utilizing laser drilling for smaller components 108. The stiffener may then be coated with a non-conductive material on three sides, leaving the top side and grounding location open. A conductive tape 122 may then be applied on the top side of the stiffener, on the non-conductive material 120. Components 108 may then be inserted into the openings 105 and component ground pads 114' may be attached to the conductive adhesive tape 122. The stiffener assembly may then be assembled on the package substrate as described in reference to FIG. 1*c*, for example.

The various embodiments of the package assemblies/structures described herein enable less warpage of thin packages, that may be caused by CTE differences between low CTE die and a high CTE substrate, wherein warpage can occur during temperature changes, such as during reflow temperature, which may lead to opens at second level interconnects, for example. A metal stiffener attached to the die side of an organic substrate has been used for warpage reduction, but consumes much real estate, since components and the stiffener compete for real estate on top side of the package. The metal stiffener may also interfere with electrical signals if it is not grounded.

Reduction in the quantity of components may affect electrical performance and reducing a stiffener size impacts package warpage negatively. By utilizing the embodiments herein, package electrical performance and mechanical performance can be simultaneously improved without increasing form factor. Various component designs may be closely packed to achieve mechanical performance without impacting electrical performance.

Figure 2:
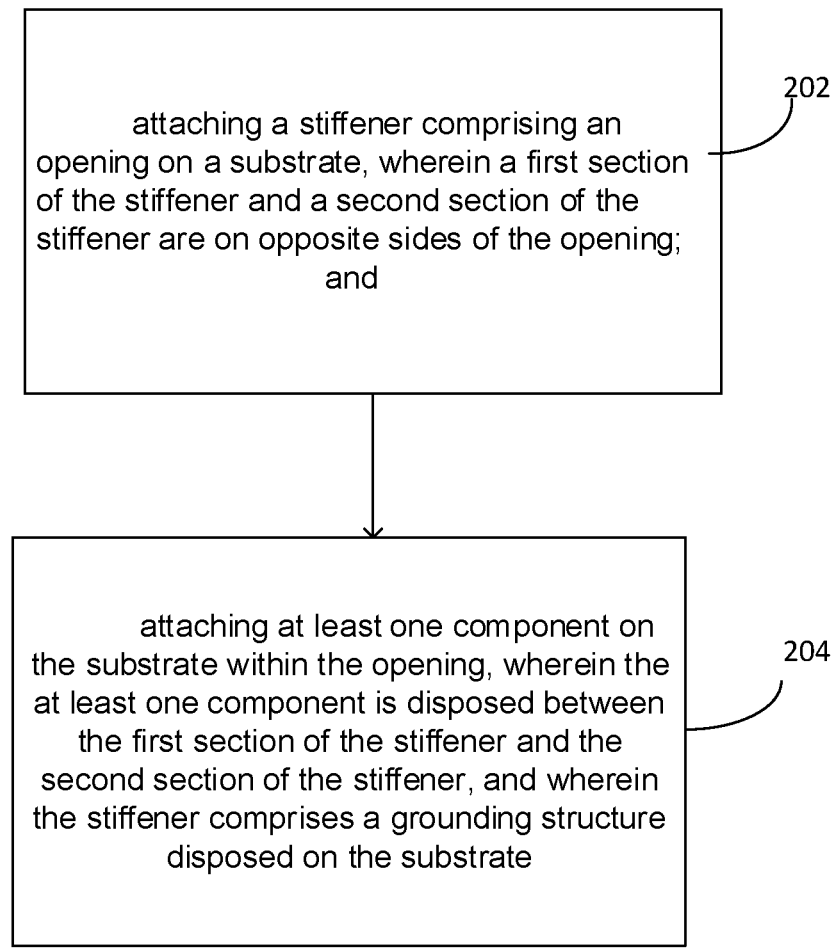
FIG. 2 represents a flow chart of a method according to embodiments.

FIG. 2 depicts a method 300 of forming a package structure according to embodiments herein. At step 302, a stiffener may be attached comprising an opening on a substrate, wherein a first section of the stiffener and a second section of the stiffener are on opposite sides of the opening. The stiffener may comprise a metal stiffener, and the opening may be punched out/laser drilled openings to accommodate components, such as passive components.

At step 304, at least one component may be attached on the substrate within the opening, wherein the at least one component is disposed between the first section of the stiffener and the second section of the stiffener, and wherein the stiffener comprises a grounding structure disposed on the substrate. The at least one component may comprise a die side capacitor, in an embodiment, wherein the stiffener may be grounded to the substrate according to any of the grounding examples/methods provided in the embodiments herein.

The structures of the embodiments herein may be coupled with any suitable type of structures capable of providing electrical communications between a microelectronic device, such as a die, disposed in package structures, and a next-level component to which the package structures may be coupled (e.g., a circuit board). The device/package structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external devices/layers. In some embodiments the structures may further comprise a plurality of dies, which may be stacked upon one another, depending upon the particular embodiment. In an embodiment, the die(s) may be partially or fully embedded in a package structure.

The various embodiments of the package structures included herein may be used for system on a chip (SOC) products, and may find application in such devices as smart phones, notebooks, tablets, wearable devices and other electronic mobile devices. In various implementations, the package structures may be included in a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

Figure 3:
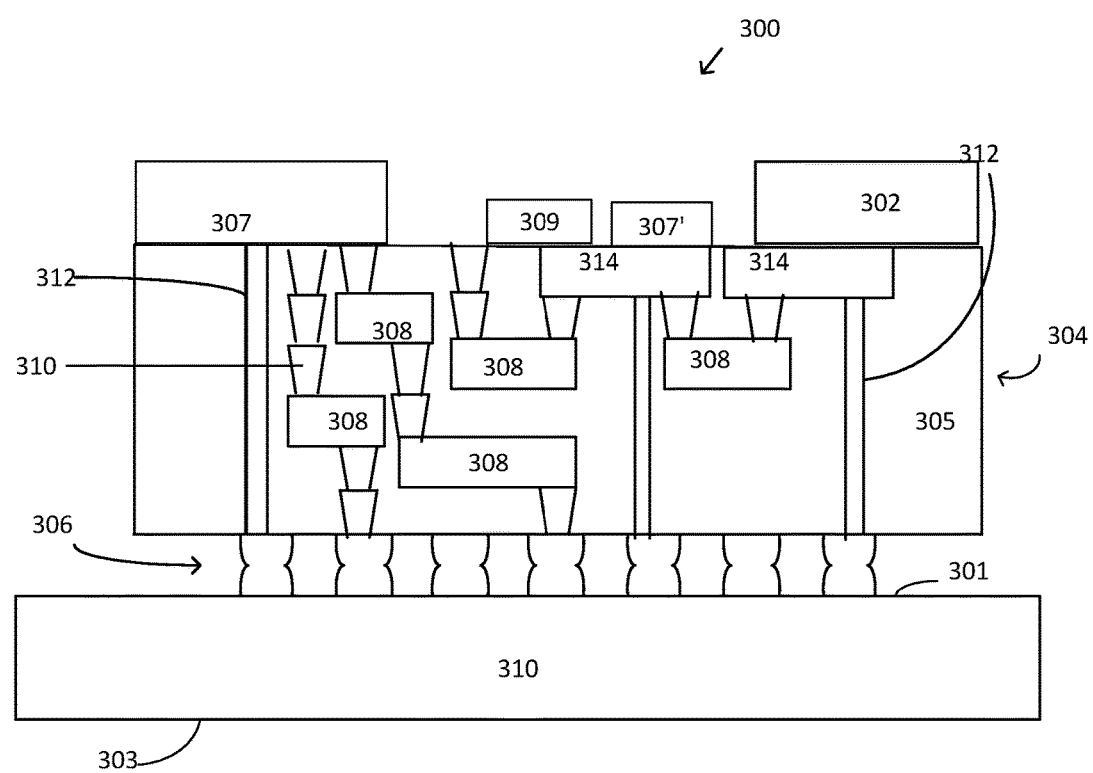
FIG. 3 represents a cross sectional view of a computing system according to embodiments.

Turning now to FIG. 3, illustrated is a cross sectional view of an embodiment of a computing system 300. The system 300 includes a mainboard 310 or other circuit board. Mainboard 310 includes a first side 301 and an opposing second side 303, and various components may be disposed on either one or both of the first and second sides 301, 303. In the illustrated embodiment, the computing system 300 includes a die 302, a stiffener 307, 307', and a component 309, such as a passive component, disposed on a substrate 304. The die 302, the stiffener 307, 307', the substrate 102 and the passive component 309 may comprise any of the features/architectures of the embodiments herein. The substrate 304 may comprise an interposer 304, for example. The substrate 304 may comprise various levels of conductive layers 314, 308, for example, which may be electrically and physically connected to each other by via structures 310. The substrate 304 may further comprise through substrate vias 312. Dielectric material 305 may separate/isolate conductive layers from each other within the substrate 304. Joint structures 306, may electrically and physically couple the substrate 304 to the board 310. The computing system 300 may comprise any of the embodiments described herein.

System 300 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 310 may comprise any suitable type of circuit board or other substrate capable of providing electrical communication between one or more of the various components disposed on the board. In one embodiment, for example, the mainboard 310 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 310. However, it should be understood that the disclosed embodiments are not limited to the above-described PCB and, further, that mainboard 310 may comprise any other suitable substrate.

Figure 4:
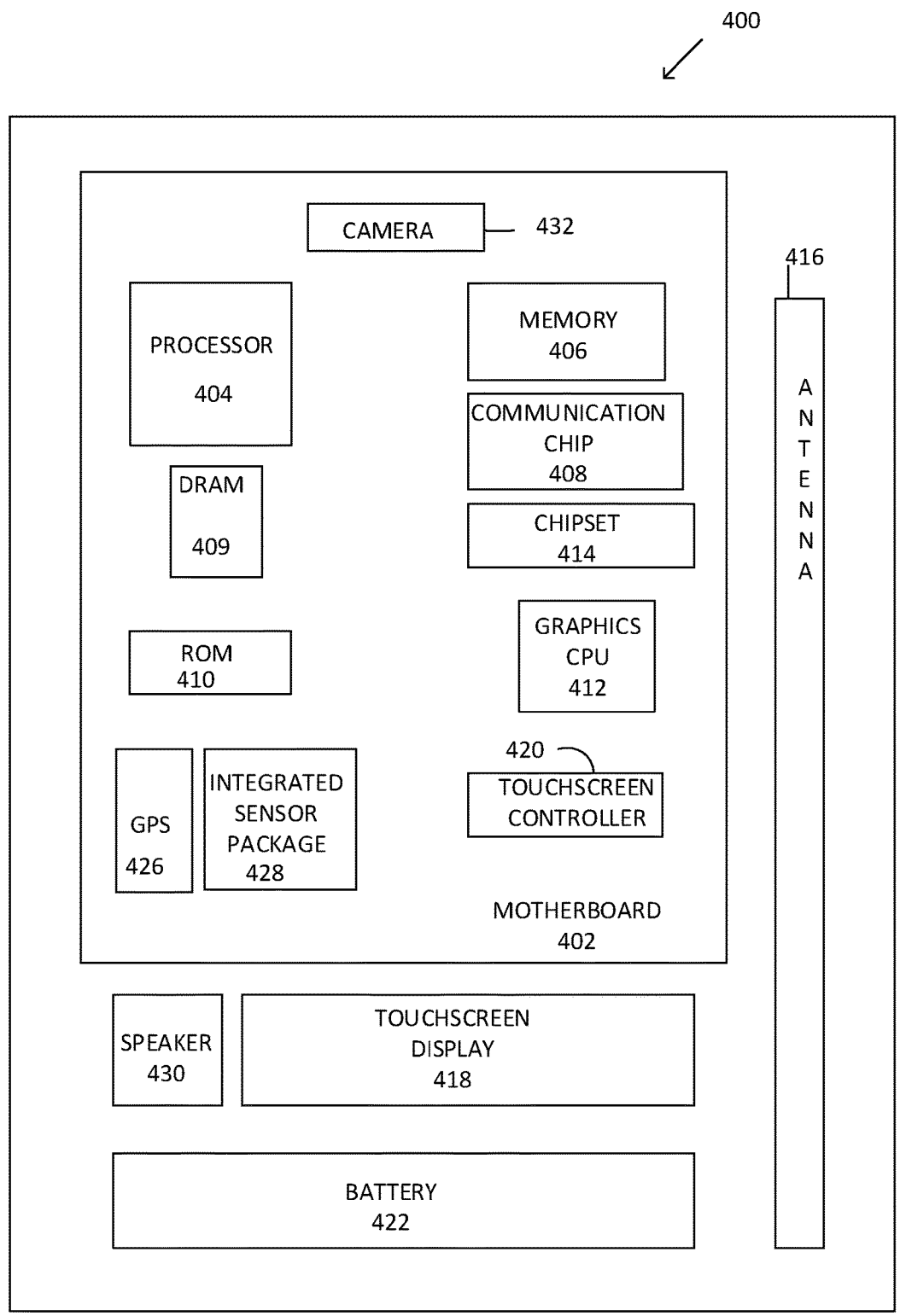
FIG. 4 represents a schematic of a computing device according to embodiments.

FIG. 4 is a schematic of a computing device 400 that may be implemented incorporating embodiments of the package structures described herein. For example, any suitable ones of the components of the computing device 400 may include, or be included in, a package structure, such as package structure 100 of FIG. 1a, for example, or in accordance with any of the embodiments disclosed herein. In an embodiment, the computing device 400 houses a board 402, such as a motherboard 402 for example. The board 402 may include a number of components, including but not limited to a processor 404, an on-die memory 406, and at least one communication chip 408. The processor 404 may be physically and electrically coupled to the board 402. In some implementations the at least one communication chip 408 may be physically and electrically coupled to the board 402. In further implementations, the communication chip 408 is part of the processor 404.

Depending on its applications, computing device 400 may include other components that may or may not be physically and electrically coupled to the board 402, and may or may not be communicatively coupled to each other. These other components include, but are not limited to, volatile memory (e.g., DRAM) 409, non-volatile memory (e.g., ROM) 410, flash memory (not shown), a graphics processor unit (GPU) 412, a chipset 414, an antenna 416, a display 418 such as a touchscreen display, a touchscreen controller 420, a battery 422, an audio codec (not shown), a video codec (not shown), a global positioning system (GPS) device 426, a speaker 430, a camera 432, compact disk (CD) (not shown), digital versatile disk (DVD) (not shown), and so forth). These components may be connected to the system board 402, mounted to the system board, or combined with any of the other components.

The communication chip 408 enables wireless and/or wired communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 408 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 400 may include a plurality of communication chips 408. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 400 may be a laptop, a netbook, a notebook, an ultrabook, a smartphone, a tablet, a personal digital assistant (PDA), an ultra mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Embodiments of the package structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

EXAMPLES

Example 1 is a microelectronic package structure comprising a die on a substrate, a component adjacent the die on the substrate, a first region of a non-conductive adhesive on the substrate and adjacent a first side of the component, and a second region of a non-conductive adhesive adjacent a second side of the component, a first section of a stiffener on the first region of the non-conductive adhesive, wherein the first section is adjacent the first side of the component; and a second section of the stiffener on the second region of the non-conductive substrate, wherein the second section is adjacent the second side of the component.

Example 2 includes the microelectronic package structure of example 1 wherein a grounding structure is disposed between the second side of the component and the second section of the stiffener, wherein the solder grounding structure is capable of grounding the stiffener to the substrate.

Example 3 includes the microelectronic package structure of example 1 wherein a grounding contact is disposed on a bottom surface of the first section of the stiffener, wherein the grounding contact is disposed on the substrate.

Example 4 includes the microelectronic package structure of example 2 wherein a non-conductive coating is disposed on a top surface and on side surfaces of the first and second sections of the stiffener.

Example 5 includes the microelectronic package structure of claim 2 wherein the component is disposed in a vertical arrangement, wherein a top contact extends across the entire top surface of a conductive material of the component, and wherein a bottom contact extends across the entire bottom surface of the conductive material of the component.

Example 6 includes the microelectronic package structure of example 1 wherein the first section and the second section are separated from each other by openings in the stiffener.

Example 7 includes the microelectronic package structure of example 1 wherein the component is disposed within the openings, and wherein the component comprises at least one of a die side capacitor, a resistor or an inductor.

Example 8 includes the microelectronic package structure of example 1 wherein an array of components is disposed within the openings.

Example 9 is a microelectronic package structure comprising a die on a substrate, a component adjacent the die on the substrate, a first section of a stiffener adjacent a first side of the component; and a second section of the stiffener adjacent a second section side of the die side component.

Example 10 includes the microelectronic package structure of example 9 wherein a conductive adhesive is disposed between the first section and the substrate, and wherein a conductive adhesive is between the second section of the stiffener and the substrate.

Example 11 includes the microelectronic package structure of example 10 wherein an array of components are disposed between the first section and the second section of the stiffener.

Example 12 includes the microelectronic package structure of example 9 wherein a non-conductive adhesive is disposed between the first section of the stiffener and the substrate, and between the second section of the stiffener and the substrate.

Example 13 includes the microelectronic package structure of example 12 wherein the component comprises a first contact and a second contact, wherein the first contact extends across an entire length of a top surface of a conductive material of the component, and wherein a second contact extends across an entire length of a bottom surface of the conductive material of the component.

Example 14 includes the microelectronic package structure of example 9 wherein the stiffener comprises a grounding contact disposed between on a bottom portion of the stiffener and the substrate.

Example 15 includes the microelectronic package structure of example 9 wherein a grounding structure is disposed between the second section of the stiffener and a second side of the component.

Example 16 includes the microelectronic package structure of example 9, wherein the component comprises at least one of a dies side capacitor, an inductor or a resistor.

Example 17 is a method of forming a microelectronic package structure, comprising: attaching a stiffener on a substrate, wherein a first section of the stiffener and a second section of the stiffener are on opposite sides of an opening; and attaching at least one component on the substrate within the opening, wherein the at least one component is disposed between the first section of the stiffener and the second section of the stiffener, and wherein the stiffener comprises a grounding structure disposed on the substrate.

Example 18 includes the method of forming the microelectronic package structure of example 17 wherein attaching the component further comprises applying a solder between a contact of the component and a second side of the stiffener to ground the stiffener.

Example 19 includes the method of forming the microelectronic package structure of example 17 wherein attaching the stiffener comprises applying a grounding structure on a bottom surface of the first section of the stiffener, wherein the grounding structure is disposed between the first section and the substrate.

Example 20 includes the method of forming the microelectronic package structure of example 19 further comprising wherein the component comprises a vertical component, wherein the component comprises a first contact and a second contact, wherein the first contact extends across an entire length of a top surface of a conductive material of the component, and wherein a second contact extends across an entire length of a bottom surface of the conductive material of the component. wherein the first die comprises a flip chip die.

Example 21 includes the method of forming the microelectronic package structure of example 19 further comprising wherein a non-conductive coating is formed on a top surface and side surfaces of the first and second sections of the stiffener.

Example 22 includes the method of forming the microelectronic package structure of example 19 further comprising wherein a non-conductive coating is disposed around the grounding structure.

Example 23 includes the method of forming the microelectronic package structure of example 17 wherein attaching the component comprises attaching an array of components on the substrate.

Example 24 includes the method of forming the microelectronic package structure of example 17 wherein the component comprises at least one of a dies side capacitor, an inductor or a resistor Example 25 includes the method of forming the microelectronic package structure of example 23 wherein a conductive coating is disposed between the stiffener and the substrate.

Example 26 includes the method of example 17 wherein the microelectronic package structure comprises a portion of a mobile device.

Example 27 includes the method of example 17 wherein the stiffener comprises a metal stiffener.

Example 28 includes the method of example 17 wherein the substrate comprises an organic substrate.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A method of forming a microelectronic package structure, comprising:
    attaching a stiffener on a substrate, wherein a first section of the stiffener and a second section of the stiffener are on opposite sides of an opening, and wherein a grounding structure is on at least a portion of at least one of the first section of the stiffener or the second section of the stiffener; and
    attaching at least one component on the substrate within the opening, wherein the at least one component is between the first section of the stiffener and the second section of the stiffener.

2. The method of claim 1 wherein attaching the component further comprises applying a solder between a contact of the component and a second side of the stiffener to ground the stiffener.

3. The method of claim 1 wherein the component comprises at least one of a dies side capacitor, an inductor or a resistor.

4. The method of claim 1 wherein attaching the component comprises attaching an array of components on the substrate.

5. The method of claim 4 wherein a conductive coating is between the stiffener and the substrate.

6. The method of claim 1 wherein attaching the stiffener comprises applying the grounding structure on a bottom surface of the first section of the stiffener, wherein the grounding structure is between the first section of the stiffener and the substrate.

7. The method of claim 6 further comprising wherein the component comprises a vertical component, wherein the component comprises a first contact and a second contact, wherein the first contact extends across an entire length of a top surface of a conductive material of the component, and wherein a second contact extends across an entire length of a bottom surface of the conductive material of the component.

8. The method of claim 6 further comprising wherein a non-conductive coating is formed on a top surface and side surfaces of the first and second sections of the stiffener.

9. The method of claim 6 further comprising wherein a non-conductive coating is around the grounding structure.

10. A microelectronic package structure comprising:
    a die on a substrate;
    a component adjacent the die on the substrate;
    a first section of a stiffener adjacent a first side of the component; and
    a second section of the stiffener adjacent a second section side of the component, wherein a grounding structure is between the second section of the stiffener and a second side of the component.

11. The microelectronic package structure of claim 10 wherein the stiffener comprises a grounding contact between on a bottom portion of the stiffener and the substrate.

12. The microelectronic package structure of claim 10, wherein the component comprises at least one of a dies side capacitor, an inductor or a resistor.

13. The microelectronic package structure of claim 10 wherein a conductive adhesive is between the first section and the substrate, and wherein a non-conductive adhesive is between the second section of the stiffener and the substrate.

14. The microelectronic package structure of claim 13 wherein an array of components are between the first section and the second section of the stiffener.

15. The microelectronic package structure of claim 10 wherein a non-conductive adhesive is between the first section of the stiffener and the substrate, and between the second section of the stiffener and the substrate.

16. The microelectronic package structure of claim 15 wherein the component comprises a first contact and a second contact, wherein the first contact extends across an entire length of a top surface of a conductive material of the component, and wherein a second contact extends across an entire length of a bottom surface of the conductive material of the component.

17. A microelectronic package structure comprising:
    a die on a substrate;
    a component adjacent the die on the substrate, wherein the component comprises one of a resistor, a capacitor or an inductor;
    a first region of a non-conductive adhesive on the substrate and adjacent a first side of the component, and a second region of a non-conductive adhesive adjacent a second side of the component;
    a first section of a stiffener on the first region of the non-conductive adhesive, wherein the first section is adjacent the first side of the component; and
    a second section of the stiffener on the second region of the non-conductive adhesive, wherein the second section is adjacent the second side of the component, wherein a grounding structure is between the second side of the component and the second section of the stiffener, wherein the grounding structure is capable of grounding the stiffener to the substrate.

18. The microelectronic package structure of claim 17 wherein the component is in a vertical arrangement, wherein a top contact extends across the entire top surface of a conductive material of the component, and wherein a bottom contact extends across the entire bottom surface of the conductive material of the component.

19. The microelectronic package structure of claim 17 wherein a grounding contact is on a bottom surface of the first section of the stiffener, wherein the grounding contact is on the substrate.

20. The microelectronic package structure of claim 17 wherein a non-conductive coating is on a top surface and on side surfaces of the first and second sections of the stiffener.

21. The microelectronic package structure of claim 17 wherein the first section and the second section are separated from each other by openings in the stiffener.

22. The microelectronic package structure of claim 21 wherein the component is within the openings, and wherein the component comprises at least one of a die side capacitor, a resistor or an inductor.

23. The microelectronic package structure of claim 21 wherein an array of components is within the openings.

\* \* \* \* \*